US012621740B2

(12) United States Patent
Barois et al.

(10) Patent No.: US 12,621,740 B2
(45) Date of Patent: May 5, 2026

(54) TRANSMISSION METHOD AND NODE DEVICE IMPLEMENTING SAID METHOD

(71) Applicant: SAGEMCOM ENERGY & TELECOM SAS, Rueil Malmaison (FR)

(72) Inventors: Jérôme Barois, Rueil Malmaison (FR); Guillaume Bacri, Rueil Malmaison (FR)

(73) Assignee: SAGEMCOM ENERGY & TELECOM SAS, Bois-Colombes (FR)

( * ) Notice: Subject to any disclaimer, the term of this patent is extended or adjusted under 35 U.S.C. 154(b) by 350 days.

(21) Appl. No.: 17/885,862

(22) Filed: Aug. 11, 2022

(65) Prior Publication Data

US 2023/0063552 A1 Mar. 2, 2023

(30) Foreign Application Priority Data

Aug. 26, 2021 (FR) ...................................... 2108915

(51) Int. Cl.
*H04W 40/06* (2009.01)
*H03M 13/15* (2006.01)
*H04W 40/08* (2009.01)

(52) U.S. Cl.
CPC ....... *H04W 40/06* (2013.01); *H03M 13/1515* (2013.01); *H04W 40/08* (2013.01)

(58) Field of Classification Search
CPC . H04W 40/06; H04W 40/08; H03M 13/1515; H04L 45/24; H04L 12/2803;

(Continued)

(56) References Cited

U.S. PATENT DOCUMENTS

2008/0130673 A1* 6/2008 Cregg ..................... H04J 13/00
340/12.3
2013/0188670 A1* 7/2013 Sun .......................... H04B 3/58
375/211

(Continued)

FOREIGN PATENT DOCUMENTS

EP 1 351 408 A1 10/2003
WO 2009/001212 A2 12/2008
WO 2009/149427 A2 12/2009

OTHER PUBLICATIONS

May 2, 2022 French Search Report for French Application FR 2108915.

*Primary Examiner* — Dady Chery
(74) *Attorney, Agent, or Firm* — Williams Mullen; R. Brian Drozd

(57) ABSTRACT

A transmission method makes it possible to transmit data from a first node device to a second node device belonging to a network neighbourhood of the first node device, the first and second node devices belonging to an electrical supply network. These nodes are configured for transmitting the data by powerline and by radio frequency. The method comprises the following steps performed by the first node device: distributing the data in two groups of data by an operation of interlacing the data, each group being associated with a communication medium from powerline and radio frequency, and transmitting each data item to a MAC layer of the communication medium associated with the group to which the data item belongs.

10 Claims, 8 Drawing Sheets

(58) Field of Classification Search
CPC ..... H04L 2012/2841; H04L 2012/2843; H04L
12/28; H04J 13/00; H05B 47/19; H04B
2203/5408; H04B 2203/5416; H04B
2203/5445; H04B 3/54; Y02B 20/40
See application file for complete search history.

(56) References Cited

U.S. PATENT DOCUMENTS

| | | | |
|---|---|---|---|
| 2013/0254615 A1* | 9/2013 | Vijayasankar ...... | G06F 11/1004 |
| | | | 714/748 |
| 2020/0186197 A1* | 6/2020 | Teboulle ................ | G01D 4/004 |
| 2021/0014006 A1* | 1/2021 | Duan .................... | H04L 1/1812 |
| 2022/0151166 A1* | 5/2022 | Siaperas ............... | A01G 23/06 |

* cited by examiner

Encode the data — S10

Obtain two interlacing tables, each table being associated with a particular communication medium — S12

Transmit each encoded data item to the MAC layer of the communication medium associated with the interlacing table in which said data item is located — S14

G3-PLC MAC     RF MAC

TRANSMISSION METHOD AND NODE DEVICE IMPLEMENTING SAID METHOD

TECHNICAL FIELD

At least one embodiment relates to a transmission method for transmitting data from a first node device to a second node device belonging to a network neighbourhood of the first node device, the first and second node devices being configured for transmitting the data by powerline and by radio frequency. At least one embodiment relates to a node device implementing said transmission method.

PRIOR ART

Powerline communications PLC are developing, in particular in the context of electrical supply networks of the AMM type (the acronym signifying "automated meter management"). Communication networks are thus implemented in electrical supply networks for the automated collection, by a base node device (also referred to as a "data concentrator") in the network, from smart electricity meters, of energy consumption reading data that said smart electricity meters are respectively responsible for monitoring.

The G3-PLC communication standard is defined to enable the various node devices (in particular data concentrator and smart electricity meters) in such a network to communicate with each other. The standard is specified in the ITU-T recommendation G.9903, which describes in particular the physical layer (PHY) and the data link layer (DLL) of the OSI model (the acronym for "Open Systems Interconnection"). The G3-PLC standard is intended to be used in frequency bands ranging from 10 to 490 kHz. It supports more particularly the following frequency bands: the CENELEC A frequency band, which ranges approximately from 35 kHz to 91 kHz; the FCC frequency band, which ranges approximately from 150 kHz to 480 kHz; the ARIB frequency band, which ranges approximately from 150 kHz to 400 kHz; and the CENELEC B frequency band, which ranges approximately from 98 kHz to 122 kHz. These various frequency bands have different characteristics in terms of rate, range and resistance to disturbances, in particular.

In a development of the G3-PLC standard defined in an Annex H of the ITU-T recommendation G.9903 (2017) Amendment 1 (May 2021), called G3-PLC Hybrid PLC & RF, an RF (the acronym for radio-frequency) radio channel can be used in place of one of said PLC frequency bands. More precisely, this version of the standard allows the occasional use of a secondary radio physical layer based on an SUN FSK modulation as defined in IEEE 802.15.4:2015. Thus, by using the various G3-PL and RF media for transmitting data, the electrical supply network maximises its coverage and its resilience. An electrical-supply network node capable of sending and receiving data using the two media (PLC and RF) is called a hybrid node.

However, in G3-PLC Hybrid PLC & RF, the choice of communicating between two hybrid nodes of the communication network either by powerline on a PLC frequency band or by radio frequency on an RF channel is determined at the time of construction or reconstruction of the communication routes. This choice of the communication medium used between two hybrid nodes of the network is generally fixed for several hours. Thus the unicast messages are transmitted between said two hybrid nodes during this period either on a PLC frequency band or on an RF channel according to the choice made at the time of the construction or reconstruction of the route. The G3-PLC Hybrid PLC & RF standard defined in Amendment 1 (May 2021) therefore does not make it possible to use all the flexibility and robustness offered by PLC/RF hybridisation.

It is desirable to overcome these various drawbacks of the prior art. It is in particular desirable to propose a transmission method that makes it possible to improve the robustness to errors of such a hybrid communication network.

DISCLOSURE OF THE INVENTION

At least one embodiment relates to a transmission method for transmitting data from a first node device to a second node device belonging to a network neighbourhood of said first node device, said first and second node devices belonging to an electrical supply network and being configured for transmitting said data by powerline and by radio frequency. The method comprises the following steps performed by said first node device:

distributing the data in two groups of data by an operation of interlacing said data, each group being associated with a communication medium from powerline and radio frequency, and transmitting each data item to a MAC layer of the communication medium associated with the group to which said data item belongs.

Advantageously, robustness to errors is improved by interlacing the data that are distributed between the various communication media.

According to a particular embodiment, the method furthermore comprises encoding the data by a Reed-Solomon encoder. The step of distributing the data in two groups of data by an operation of interlacing said data applies to the encoded data.

According to a particular embodiment, distributing the data in two groups of data by an operation of interlacing said data comprises:

generating a first bit stream of N bits, each binary value being associated with a communication medium from powerline and radio frequency, N being the number of data to be transmitted to the MAC layer;

permuting, by bit reversal, the bits in the first bit stream to obtain a second bit stream;

and transmitting each data item to a MAC layer of the communication medium associated with a group to which said data item belongs comprises:

transmitting each data item to the MAC layer of the communication medium associated with the value of the bit corresponding to said data item in the second bit stream.

According to a particular embodiment, generating a first bit stream of N bits comprises:

a) initialising the parameters k, $N_{RF}$ and $N_{PLC}$ to 0.

b) if $D_{PLC} < D_{RF}$, positioning a bit $b_k$ at a first value and incrementing $N_{RF}$ by 1, otherwise positioning the bit $b_k$ at a second value and incrementing $N_{PLC}$ by 1, where $D_{PLC}$ is a rate available for the powerline communication medium and $D_{RF}$ is a rate available for the radio-frequency communication medium;

c) if $N_{PLC}/(N_{PLC}+N_{RF}) \leq D_{PL}/(D_{PLC}+D_{RF})$ positioning a bit $b_{k+1}$ at said second value and incrementing $N_{PLC}$ by 1, otherwise positioning the bit $b_{k+1}$ at said first value and incrementing $N_{RF}$ by 1;

d) if $(k+1) < N-1$, incrementing k by 1 and resuming at the step c).

According to a particular embodiment, distributing the data in two groups of data by an operation of interlacing said data comprises:

obtaining two interlacing tables, each interlacing table being associated with a communication medium;

transmitting each data item to the MAC layer of the communication medium associated with the interlacing table in which said data item is located.

According to a particular embodiment, obtaining two interlacing tables, each interlacing table being associated with a communication medium, comprises:

obtaining a first interlacing table T [m, n] of bits representing the data to be transmitted, the first interlacing table comprising as many second interlacing tables Ti $[m_i, n_i]$ of bits as there are communication media, each second interlacing table Ti $[m_i, n_i]$ being attributed to only one of said communication media, differences in dimensions between second interlacing tables being liable to generate one or more so-called invalid positions included in the first interlacing table but not included in the at least one of the second interlacing tables, interlacing the bits by successive shifts of the rows in and of the columns n of the first interlacing table T [m, n], the successive shifts being performed in the form of circular permutations of the bits respectively by row and by column, moving any bit detected as present at an invalid position in the first interlacing table to a position in a second interlacing table that is available after the interlacing of the bits of the first interlacing table, so that each second interlacing table comprises bits allocated to one of said groups of data.

According to a particular embodiment, the step for interlacing the bits, and the dimensions of the second interlacing tables, are in accordance with the ITU-T recommendation G.9903.

According to a particular embodiment, in the case where a data item is transmitted by powerline, said data item is transmitted on at least one frequency band belonging to a set of frequency bands comprising:

the CENELEC A frequency band;

the CENELEC B frequency band; and the FCC frequency band or the ARIB frequency band.

According to a particular embodiment, in the case where a data item is transmitted by radio frequency, said data item is transmitted on a frequency band ranging from 863 MHz to 870 MHz.

A node device is also described that belongs to an electrical supply network and is configured for transmitting data by powerline and by radio frequency to another node in said electrical supply network belonging to its network neighbourhood. The node device comprises:

means for distributing the data in two groups of data by an operation of interlacing said data, each group being associated with a communication medium from powerline and radio frequency, and means for transmitting each data item to a MAC layer of the communication medium associated with a group to which said data item belongs.

A computer program product is described that comprises instructions for implementing the transmission method according to one of the preceding embodiments, when said program is executed by a processor.

A storage medium is also described that stores a computer program comprising instructions for implementing the transmission method according to one of the preceding embodiments, when said program is executed by a processor.

BRIEF DESCRIPTION OF THE DRAWINGS

The features of the invention mentioned above, as well as others, will emerge more clearly from the reading of the following description of an example embodiment, said description being made in relation to the accompanying drawings, among which.

DETAILED DISCLOSURE OF EMBODIMENTS

Figures 1, 2:
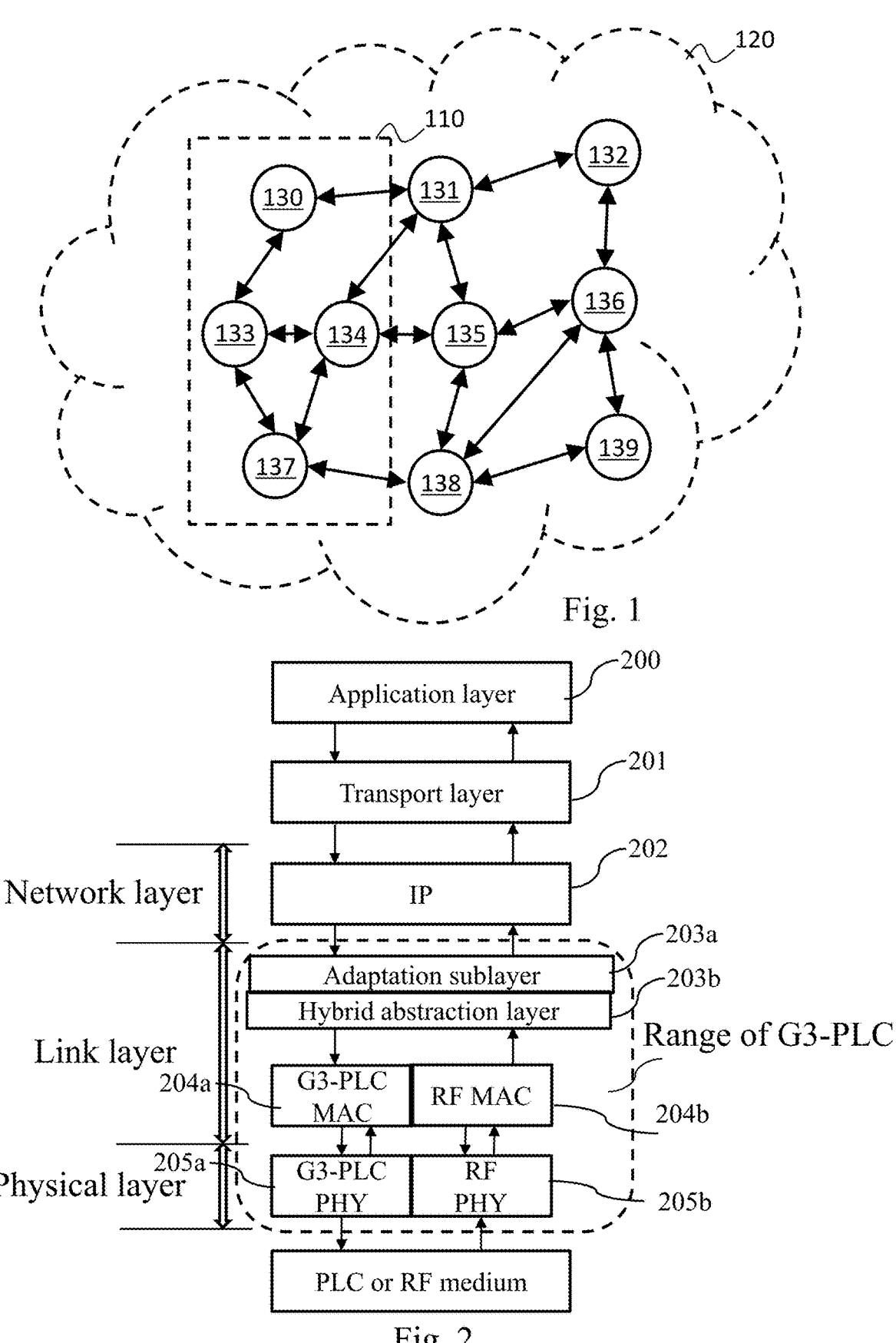
FIG. 1 illustrates schematically a mesh communication network.
FIG. 2 illustrates schematically the various layers of an OSI model in the particular case of the G3-PLC Hybrid PLC & RF standard.

FIG. 1 illustrates schematically a mesh communication network 120. The mesh communication network 120 is for example an electrical supply network of the AMM type. The mesh communication network 120 relies on powerline communications PLC or radio-frequency RF communications for enabling a base node device (also called a "data concentrator") to collect, from smart electricity meters, energy consumption reading data from electrical installations that said smart electricity meters are respectively responsible for monitoring. The data concentrator and the smart electricity meters are thus node devices of the mesh communication network 120. The mesh communication network 120 may comprise other node devices, for example installed at electrical transformers. The communication network 120 therefore has a mesh structure, as shown schematically on FIG. 1 by means of arrows, where node devices fulfil the role of relays for increasing the range of communications in the mesh communication network 120, as detailed below. Thus, one and the same smart electricity meter potentially has available several paths for reaching the data concentrator, and vice versa. In the remainder of the document, the terms "smart electricity meter" and "meter" are used interchangeably.

The present invention is thus particularly adapted to the context of G3-PLC Hybrid PLC & RF technology as defined in the ITU-T recommendation G.9903 (2017) Amendment 1 (May 2021) and more particularly in Annex H.

The mesh communication network 120 thus comprises a plurality of node devices 130, 131, 132, 133, 134, 135, 136, 137, 138, 139. A network neighbourhood is associated with each node device in the mesh communication network 120. On FIG. 1, the node device 133 is associated with a network neighbourhood 110 encompassing node devices 130, 134 and 137. This is because, in the mesh communication network 120, a signal or a message broadcast by a node device (such as the node device 133) is in general not visible at every point in said communication network. Each node device sending signals or messages then has a network neighbourhood, i.e. a subset of said mesh communication network 120 wherein any node device can intelligibly receive said signals or message directly coming from the node device that broadcast said signals or messages. The network neighbourhood corresponds to the range of the signals sent, according to predetermined transmission parameters (e.g. power, modulation and coding scheme, network topology, etc.) of the node device at the source of said signals and also potentially according to characteristics of the communication channel (attenuation, noise, impedance, etc.).

The mesh communication network 120 relies on a routing protocol of the reactive type, such as the LOADng protocol ("Lightweight On-demand Ad hoc Distance-vector Routing Protocol—Next Generation"). Unlike the routing protocols of the proactive type, which rely on a global knowledge of network topology, the routing protocols of the reactive type rely on on-demand route discoveries, each node device in the network then needing solely to have knowledge of its own network neighbourhood to route data in the mesh communication network 120.

To discover a suitable route in the mesh communication network 120 from a source node device (for example the node device 133) to a destination node device (for example the node device 132), it is known for the source node device to broadcast a route discovery request, called RREQ ("Route REQuest"). In the G3-PLC Hybrid PLC and RF case, the request RREQ is broadcast on the two PLC and RF media. This route discovery request is received by each node device in the network neighbourhood of said source node device. Each node device in the network neighbourhood of said source node device relays, by broadcasting, said request if said node device in question is not the destination node device. By gradual broadcasting, a plurality of route discovery requests are typically received by the destination node device, each of these requests having followed a different path in the mesh communication network 120.

Each node device that is at the origin of a message, such as for example a route discovery request, includes therein an identifier that is particular to it, as well as a sequence number, as defined in the LOADng protocol. This sequence number is a counter value particular to each node device of the mesh communication network 120. Each time a node device generates a new message, said node device increments its counter and includes in the message in question the value of said counter. Thus, when a node device receives a message, said node device analyses the identifier of the node device originating the message and the sequence included in the message, and can determine whether the message received is actually a new message or a new copy of a message already received.

Each node device can however decide not to relay a route discovery request when one or more criteria are not met. In particular, before deciding to relay said request, the node device in question typically checks whether said request comprises information representing a route cost, from the source node device to the node device in question, which is better than the route cost represented by information contained in another route discovery request previously received by the node device in question. In other words, the node device in question relays, by broadcasting, said request if said request relates to a path that has followed, from the source node device to the node device in question, a pathway with a lower cost than any other request previously received by the node device in question (and therefore for the same route discovery).

The cost of a route may rely on one or more metrics. For example, the route cost is a number of hops undergone by the request in question from the source node device. According to another example, the route cost is the result of a calculation that depends on the bandwidth of the links crossed, by the request in question, from the source node device and/or on the quality of the communication links. According to yet another example, the route cost is proportional to the latency undergone by the request in question from the source node device. Other metrics can be used for establishing a route cost, i.e. a transit cost, from the source node device to the destination node device. According to yet another example, the route cost also depends on the medium, i.e. radio or PLC, used for transmitting the data between two successive nodes.

When a node device decides to relay, by broadcasting, a route discovery request, the node device in question updates the route cost information contained in said request, so as to take into account the fact that said request is passed by the node device in question. Thus, according to such a principle, a plurality of route discovery requests typically arrive at the destination node device, each comprising information on the cost of the route that said request followed to be propagated from the source node device to the destination node device. The pathway followed by said route discovery request associated with the best route cost is next selected to enable the source node device to transmit data to the destination node device. To activate the route in question, the destination node device transmits a route discovery reply, called RREP ("Route REPly"). This route discovery reply is transmitted gradually by following the path that is the reverse of the route discovery request that was associated with the best route cost. Each node device receiving the route discovery reply updates an internal routing table, at the data link layer DLL, in order to indicate therein that any subsequent message transmitted in unicast mode from the source node device in question to the destination node device in question must be transmitted or relayed to such and such a node device of its network neighbourhood. Within the link layer, the routing tables are preferentially implemented in an adaptation sublayer responsible for implementing the routing protocol in the communication network. For example, this adaptation sublayer is in accordance with the 6LoWPAN protocol (standing for "IPv6 over Low power Wireless Personal Area Networks"), which was initially developed for supporting IPv6 in the context of IEEE 802.15.4. It should be noted that the 6LoWPAN protocol itself relies on the routing protocol of the aforementioned reactive LOADng type. A hybrid abstraction layer provides suitable services to the adaptation sublayer with a view to sending/receiving data to/from the appropriate MAC ("Medium Access Control") sublayer, i.e. RF or PLC.

By means of the routing tables thus configured, unicast communications can be made by any pair of node devices in the mesh communication network 120. Intermediate node devices therefore serve as relays when the node devices in said pair are not in the network neighbourhood of each other, and the communications thus take place gradually, each node device relying on one of its own neighbours to convey messages to their respective destinations.

To communicate between neighbouring node devices (i.e. node devices that are in the network neighbourhood of each other), the messages are transmitted in the form of modulated frames. When a modulated frame is specifically addressed to a neighbouring node device and is correctly demodulated by it, said neighbouring device retransmits an acknowledgement ACK to the node device that sent it said modulated frame on the frequency band or the RF channel on which the modulated frame was sent. A plurality of frequency bands and at least one RF channel are defined for supporting the transmission of these modulated frames, an adapted modulation scheme being associated with each of these frequency bands and with the RF channel. Each frame transmitted in the form of modulated signals begins with a preamble predefined according to the modulation scheme according to which said signals were modulated. The preamble is adapted for making it possible to synchronise in reception on said frame, i.e. to be able to determine an actual instant of start of frame. To do this, the preamble typically comprises a plurality of successive copies of one and the same symbol. The actual content and the duration of the preamble are thus predefined and depend on the modulation scheme used. The preambles of several frames are identical when the same modulation scheme is applied, and different otherwise. In the remainder of the document, to alleviate the text, the term "frequency band" is used indifferently to designate a PLC frequency band or an RF channel.

The modulation schemes (and corresponding demodulation schemes) applicable are preferentially multicarrier modulation schemes (or respectively demodulation schemes) of the OFDM type (Orthogonal Frequency Division Multiplex) in PLC or SUN-FSK (the English acronym for "Smart Utility Network—Frequency Shift Keying") in RF.

In terms of frequency bands that can be used in the context of the implementation of the mesh communication network 120, mention can be made of: the CENELEC A frequency band, which ranges approximately from 35 kHz to 91 kHz; the FCC frequency band, which ranges approximately from 150 kHz to 480 kHz; the ARIB frequency band, which ranges approximately from 150 kHz to 400 kHz; the CENELEC B frequency band, which ranges approximately from 98 kHz to 122 kHz and the RF radio channel, which ranges approximately from 863 MHz to 870 MHz. It is then possible to use: a first thirty-six carrier modulation scheme in the CENELEC A frequency band; a second seventy-two carrier modulation scheme in the FCC frequency band; a third fifty-four carrier modulation scheme in the ARIB frequency band; a fourth sixteen carrier modulation scheme in the CENELEC B frequency band and a fifth modulation scheme of the SUN-FSK type for the RF radio channel of G3-PLC Hybrid PLC & RF. The SUN-FSK modulation is defined in section 20 of the document IEEE 802.15.4:2015.

FIG. 2 illustrates schematically the various layers of an OSI model in the particular case of the G3-PLC Hybrid PLC & RF standard as defined in Annex H of the ITU-T recommendation G.9903 (2017) Amendment 1 (May 2021).

A message to be transmitted coming from an application layer 200 is transmitted to a transport layer 201. The transport layer 201 contains all the protocols responsible for managing errors and controlling the network flows. The two main protocols used are the TCP and UDP protocols. The transport layer 201 creates packets by adding headers to the data coming from the application layer 200. The packets are next transmitted to an IP layer 202, e.g. IPv6. The IP layer 202 encapsulates the packets coming from the transport layer 201 by adding in particular an IP header, e.g. IPv6. An IPv6 packet can do up to 1400 bytes. In the case where the packet has a size above a threshold value, this packet is fragmented into at least two fragments in order to adapt it to the constraints of a MAC sublayer 204a or 204b, in particular to the size of the MAC frames.

For this purpose, the G3-PLC Hybrid PLC & RF standard incorporates the 6LoWPAN protocol, which makes it possible to adapt IPv6 data packets to the constraints of the MAC sublayers 204a or 204b, in particular by fragmenting them. This is because the MAC frames used are of much smaller sizes (400 bytes maximum available per packet for the IP part) than the IPv6 packets of 1400 bytes.

An adaptation sublayer 203a incorporating the 6LoWPAN protocol and located between the IP network layer 202 and the MAC sublayer 204a or 204b of the OSI model receives, from the IP network layer 202, IPv6 packets of 1280 bytes and where applicable fragments them. Naturally, in the case of an IP packet that is sufficiently small to be contained in a single MAC G3-PLC or MAC RF frame, no fragmentation is performed.

A hybrid abstraction layer 203b next transfers the fragment, or the IP packet in the case of absence of fragmentation, to the appropriate MAC sublayer 204a or 204b according to the medium selected for transmission thereof. Hereinafter the term fragment is used for designating both a fragment obtained from a fragmented IP packet or the IP packet itself in the case of absence of fragmentation.

Transmitting a fragment on the PLC medium, i.e. on the powerline, conventionally comprises various steps, in particular a segmentation of the fragments in order to adapt them to a G3-PLC PHY physical layer 205a and an OFDM modulation of the signal. The segmentation consists in partitioning a MAC frame into PSDUs (the English acronym for "PHY Service Data Unit"). All the PSDUs coming from one and the same fragment are modulated using the same modulation scheme.

Transmitting a fragment by radio frequency over the RF channel comprises various steps, in particular a segmentation of the fragments in order to adapt them to an RF PHY physical layer 205b and a SUN-FSK modulation of the signal. As in the PLC case, the segmentation consists in partitioning a MAC frame into PSDUs (the English acronym for "PHY Service Data Unit"). All the PSDUs coming from one and the same fragment are modulated using the same modulation scheme. The specification of the RF PHY physical layer is given in sections 10, 11 and 20 of IEEE 802.15.4-2015 as amended by IEEE 802.15.4v:2017 and supplemented by Table H-5-1 of the ITU-T recommendation G.9903 (2017) Amendment 1 (May 2021).

In order to use all the flexibility offered by PLC/RF hybridisation, the communication methods described with reference to FIGS. 3 to 11 are implemented for distributing the data supplied by the adaptation sublayer 203a between the two RF MAC and PLC MAC layers optimally in order in particular to endure greater robustness to errors. More precisely, the methods described are implemented at the hybrid abstraction layer 203b.

Figures 3, 4:
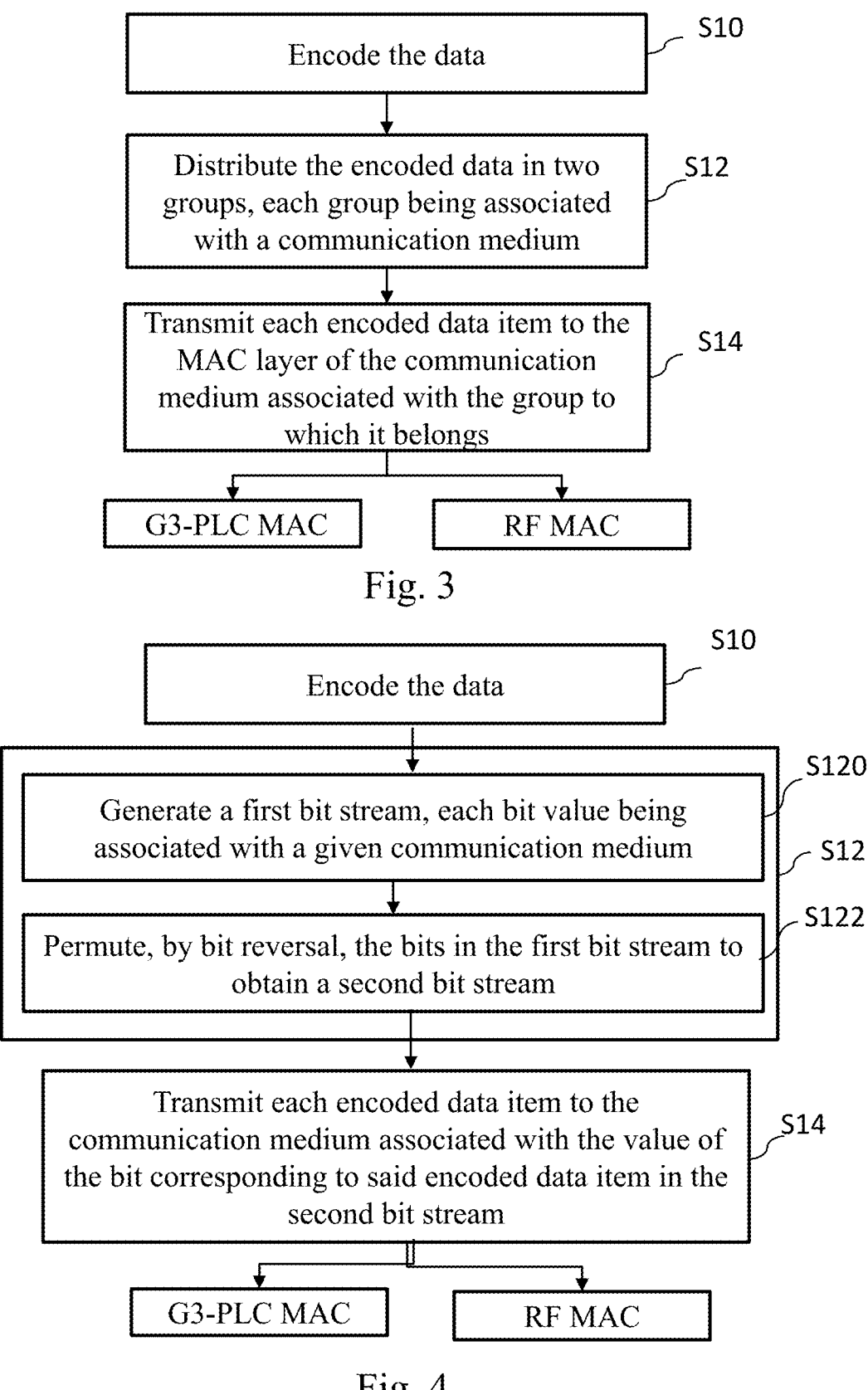
FIG. 3 illustrates schematically a transmission method according to a particular embodiment.
FIG. 4 illustrates schematically a transmission method according to a particular embodiment.

FIG. 3 illustrates schematically a method for transmitting data according to a particular embodiment. The data come for example from the IP layer.

In an optional step S10, the data coming from the IP layer possibly fragmented in accordance with the 6LoWPAN protocol are encoded, e.g. by a convolutional encoder such as an encoder of the Reed-Solomon type. In a particular embodiment, the Reed-Solomon encoder is parameterised as follows: N=255, K=247 and T=4, where N is a number of symbols transmitted, K is a number of information signals, referred to as payload, and T is a number of correctable erroneous symbols. Reed-Solomon codes are block codes. This is because they take as an input a block of data of fixed size K, each data item being a symbol of m bits. For example, m=1, 2, 3, 4, 8 or 16. 2T check symbols are added to this block, thus forming an output block of fixed size equal to N.

In a step S12, the N encoded data are distributed into two groups $G_{RF}$ and $G_{PLC}$ by an interlacing operation, each group being associated with a particular communication medium from powerline and radio frequency.

In a step S14, each encoded data item is transmitted to the MAC layer of the communication medium associated with the group to which it belongs. In other words, the encoded data that belong to the group $G_{RF}$ are transmitted to the RF MAC layer and the encoded data that belong to the other group are transmitted to the PLC MAC layer.

The node device receiving the data transmitted by PLC and RF operates in a reverse fashion. In other words, the receiving node device deinterlaces the data in a reverse manner to what is performed by the sending node device in the step S12. The data thus deinterlaced are next decoded using the decoder performing the operation that is the reverse of the one performed at the step S10. In a particular embodiment, a Reed-Solomon decoder is used.

FIG. 4 illustrates schematically a method for transmitting data according to a particular embodiment. This method comprises the step S10, identical to that of the method described with reference to FIG. 3.

In a step S120, a first bit stream is generated that comprises N bits $b_k$ with k∈[0; N−1], i.e. as many bits as there are symbols $S_k$ contained in an output block of the encoding step S10.

In a step S122, the bits of the first bit stream are permuted, for example using a bit-reversal permutation method. Such a permutation method makes it possible to keep the same number of zeros and ones as in the first bit stream and is reversible. The bit stream after permutation is called the second bit stream.

In an example embodiment, for N=255, the following F function is used:
F=[0, 128, 64, 192, 32, 160, 96, 224, 16, 144, 80, 208, 48, 176, 112, 240, 8, 136, 72, 200, 40, 168, 104, 232, 24, 152, 88, 216, 56, 184, 120, 248, 4, 132, 68, 196, 36, 164, 100, 228, 20, 148, 84, 212, 52, 180, 116, 244, 12, 140, 76, 204, 44, 172, 108, 236, 28, 156, 92, 220, 60, 188, 124, 252, 2, 130, 66, 194, 34, 162, 98, 226, 18, 146, 82, 210, 50, 178, 114, 242, 10, 138, 74, 202, 42, 170, 106, 234, 26, 154, 90, 218, 58, 186, 122, 250, 6, 134, 70, 198, 38, 166, 102, 230, 22, 150, 86, 214, 54, 182, 118, 246, 14, 142, 78, 206, 46, 174, 110, 238, 30, 158, 94, 222, 62, 190, 126, 254, 1, 129, 65, 193, 33, 161, 97, 225, 17, 145, 81, 209, 49, 177, 113,241, 9, 137, 73, 201, 41, 169, 105, 233, 25, 153, 89, 217, 57, 185, 121, 249, 5, 133, 69, 197, 37, 165, 101, 229, 21, 149, 85, 213, 53, 181, 117, 245, 13, 141, 77, 205, 45, 173, 109, 237, 29, 157, 93, 221, 61, 189, 125, 253, 3, 131, 67, 195, 35, 163, 99, 227, 19, 147, 83,211, 51, 179, 115,243, 11, 139, 75, 203, 43, 171, 107, 235, 27, 155, 91, 219, 59, 187, 123, 251, 7, 135, 71, 199, 39, 167, 103, 231, 23, 151, 87, 215, 55, 183, 119, 247, 15, 143, 79, 207, 47, 175, 111, 239, 31, 159, 95, 223, 63, 191, 127, 255]

For any k∈[0; N−1], $B_k=b_{F(k)}$ where $B_k$ is a bit of the second bit stream. For example, the value of the bit $B_5$ is equal to the value of the bit $b_{160}$. If the F function is applied twice in a row, the starting bit stream is found again.

Thus the second bit stream defines two groups of data $G_{RF}$ and $G_{PLC}$. The group $G_{RF}$ comprises for example all the data corresponding to a bit at 1 in the second bit stream and the group $G_{PLC}$ comprises all the data corresponding to a bit at 0 in the second bit stream, or vice-versa.

In the step S14, the encoded data that belong to the group $G_{RF}$ are transmitted to the RF MAC layer and the encoded data that belong to the group $G_{PLC}$ are transmitted to the PLC MAC layer. In other words, each encoded data item is transmitted to the communication medium associated with the value of the bit corresponding to said encoded data item in the second bit stream.

Thus, for any k∈[0; N−1], if $B_k$ is equal to 0, then the symbol $S_k$ output at the encoding step is transmitted to the G3-PLC MAC layer, and if $B_k$ is equal to 1, then the symbol $S_k$ output at the encoding step is transmitted to the RF MAC layer.

The transmission method described therefore makes it possible to distribute the data between the two communication media, and this reversibly. In the embodiment described above, the bit at 1 is associated with the RF communication medium and the bit at 0 is associated with the PLC communication medium. Naturally, this is a starting convention and a different choice may be made, i.e. associating a bit at 0 with the RF communication medium and associating a bit at 1 with the PLC communication medium.

Figure 5:
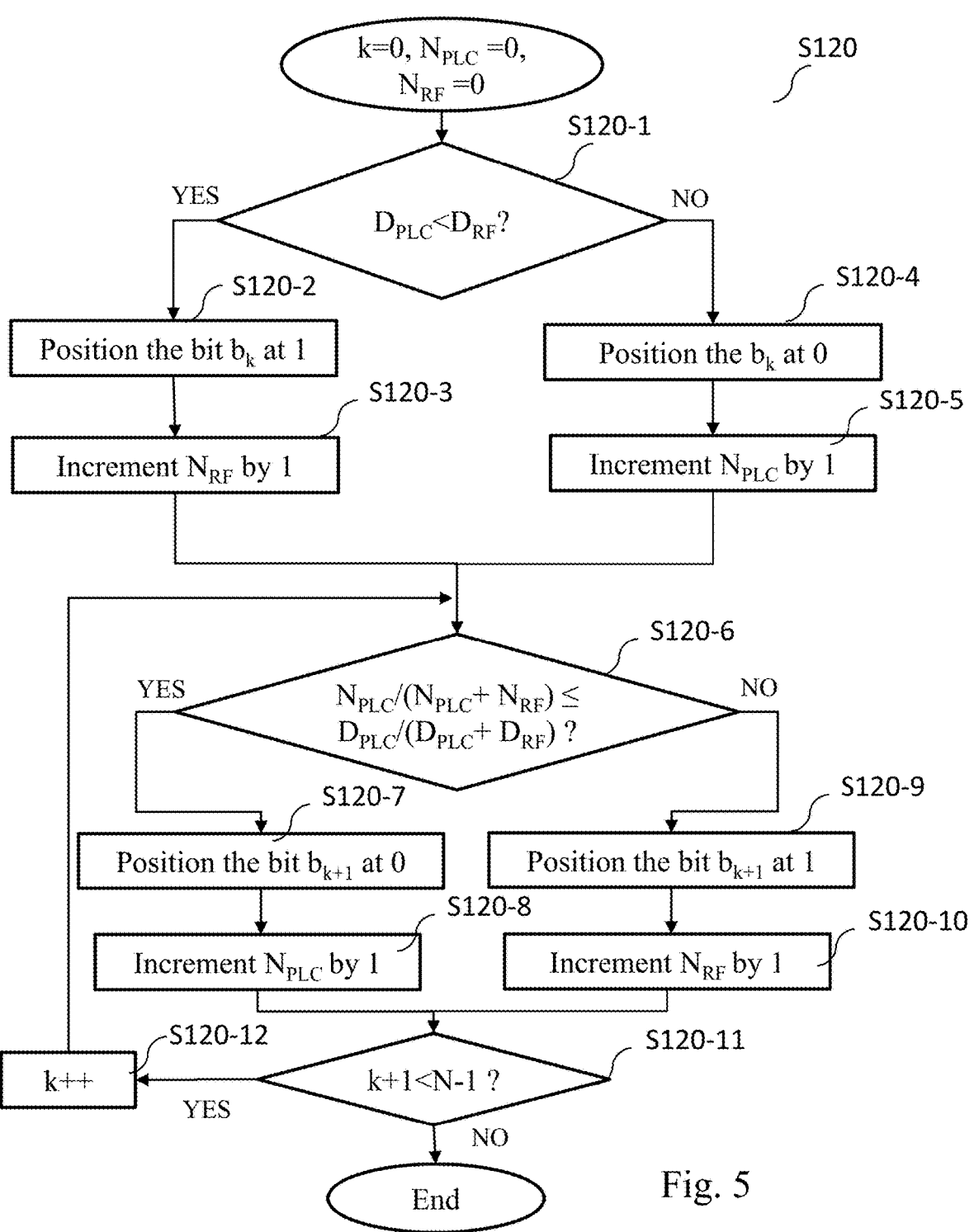
FIG. 5 illustrates in detail a step of the transmission method illustrated on FIG. 4.

FIG. 5 illustrates in detail the step S120 of the data transmission method of FIG. 4 according to a particular embodiment.

Parameters k, $N_{PLC}$ and $N_{RF}$ are initialised to 0. k is an index that identifies a bit $b_k$ in the first bit stream. $N_{PLC}$ (or respectively $N_{RF}$) represents the number of bits transmitted on the PLC (or respectively RF) medium.

In a step S120-1, a rate $D_{PLC}$ is compared with a rate $D_{RF}$. $D_{PLC}$ is a rate of data available for the powerline communication medium and $D_{RF}$ is a rate of data available for the radio-frequency communication medium. Each available data rate $D_{PLC}$ and $D_{RF}$ is known.

For powerline, $D_{PLC}$ is defined in the ITU-T document G.9903 (2017) Amendment 1 (May 2021), and more precisely in section 7.3.1, and depends on the frequency band, on the number of carriers and on the encoding that are currently selected.

For the radio frequency, $D_{RF}$ is defined in the specifications IEEE 802.15-4 and IEEE 802.15-4v_2017, and more precisely in section 20.3, and depends on the operating mode currently configured. The operating mode 1 or 2 of SUN FSK translates frequency separations that are different between the channels.

If $D_{PLC}<D_{RF}$, then the bit $b_k$ is set to 1 (S120-2) and $N_{PLC}$ is incremented by 1 (S120-3). If $D_{PLC}≥D_{RF}$, then the bit $b_k$ is set to 0 (S120-4) and $N_{RF}$ is incremented by 1 (S120-5).

In a step S120-6, $N_{PLC}/(N_{PLC}+N_{RF})$ is compared with $D_{PLC}/(D_{PLC}+D_{RF})$. If $N_{PLC}/(N_{PLC}+N_{RF})≤D_{PLC}/(D_{PLC}+D_{RF})$, the following bit $b_{k+1}$ is set to 0 (S120-7) and $N_{PCL}$ is incremented by 1 (S120-8).

If $N_{PLC}/(N_{PLC}+N_{RF})>D_{PLC}/(D_{PLC}+D_{RF})$, the following bit $b_{k+1}$ is set to 1 (S120-9) and $N_{RF}$ is incremented by 1 (S120-10).

In a step S120-11, (k+1) is compared with (N−1). If (k+1)<(N−1), then k is incremented by 1 and the method resumes at the step S120-6, otherwise the step S120 ends since all the bits $b_k$ with k∈[0; N−1] of the first bit stream are determined and therefore the first bit stream is generated. In the embodiment described above, the bit at 1 is associated with the RF communication medium and the bit at 0 is associated with the PLC communication medium. Naturally this is a starting convention and a difference choice can be made, i.e. associating a bit at 0 with the communication medium RF and associating a bit at 1 with the PLC communication medium. Thus, in the example in FIG. 5, the zeros can be replaced by ones and the ones by zeros.

Figures 6, 7:
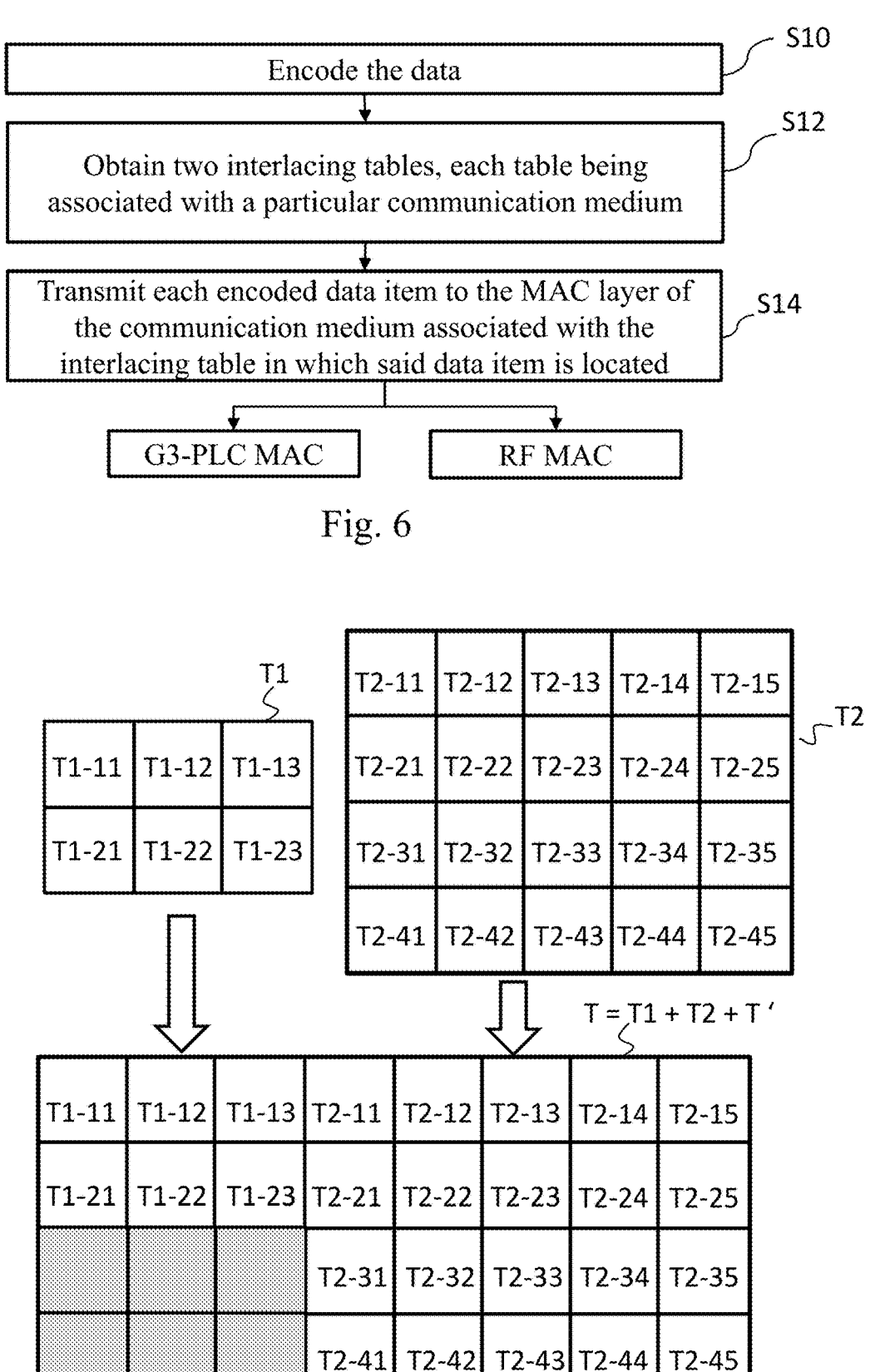
FIG. 6 illustrates schematically a transmission method according to a particular embodiment.
FIG. 7 illustrates the generation of a first data interlacing table used by the transmission method illustrated on FIG. 6, from second interlacing tables, according to a particular embodiment.

FIG. 6 illustrates schematically a data transmission method according to a particular embodiment. This method comprises the step S10 identical to that of the method described with reference to FIG. 3.

In the step S12, two interlacing tables are obtained, one table being associated with the PLC communication medium and the other table being associated with the RF communication medium.

In the step S14, the encoded data are transmitted to the RF MAC layer and to the PLC MAC layer according to the interlacing tables obtained. More precisely, each encoded data item is transmitted to the MAC layer of the communication medium associated with the interlacing table in which said data item is located.

The transmission method described therefore makes it possible to distribute the data between the two communication media, and this reversibly.

FIGS. 7 to 11 illustrate a method for obtaining the interlacing tables used at the step S14.

FIG. 7 illustrates a first interlacing table T, obtained from the concatenation of second interlacing tables T1 and T2. The interlacing tables T1 and T2 have respective dimensions (number of rows $m_i$ and of columns $n_i$) defined from the type of communication medium used. According to a particular embodiment, a first medium uses powerline and a second medium uses radio frequency. Thus the interlacing table T1 is associated with the RF communication medium. In the example of FIG. 7, its dimensions are defined by 2 rows and 3 columns. The number of columns corresponds to the number of channels and the number of rows corresponds to a number of bits to be interlaced. The number of channels is for example defined in IEEE 802.15.4v_2017 according to the operating mode, e.g. in operating mode 1 there are 69 channels and 35 channels in operating mode 2. So as to simplify the description, 3 channels are considered on FIG. 7 and therefore 3 columns for the interlacing table T1. In a similar manner, the interlacing table T2 is associated with the PLC communication medium. In the example of FIG. 7, its dimensions are defined by 4 rows and 5 columns. The interlacing table T2 is defined in the same manner as the interlacing table used at the PHY layer in sections 7.10.1 and 7.10.2 of the G3-PLC standard. Thus the dimensions of the interlacing table T2 are defined so that the number of columns is equal to the number of subcarriers used in the frequency band used for transmitting data and the number of rows depends on the number of bits to be interlaced. The interlacing table T2 of FIG. 7 corresponds to the PLC medium configured in frequency band FCC with 5 subcarriers and a QPSK modulation.

The first interlacing table T is obtained by a concatenation of second interlacing tables T1 and T2. Indices T1-11 to T1-13 symbolise the various positions of the first row of the interlacing table T1, and indices T1-21 to T1-23 symbolise the various positions of the second row of the interlacing table T1. In the same way, indices T2-11 to T2-15 symbolise the various positions of the first row of the interlacing table T2, indices T2-21 to T2-25 symbolise the various positions of the second row of the interlacing table T2, indices T2-31 to T2-35 symbolise the various positions of the third row of the interlacing table T2 and indices T2-41 to T2-45 symbolise the various positions of the fourth row of the second interlacing table T2. Thus, more generally, an index Ti [$m_j$,$n_i$] symbolises in the present description a position at the $m^{th}$ row and at the $n^{th}$ column of a table Ti. The indices previously mentioned are affixed in the various positions of the interlacing table T obtained by concatenating the interlacing tables T1 and T2, on FIG. 7 to best illustrate the concatenation mode used. According to one embodiment, the interlacing tables T1 and T2 are concatenated to define the first table T by making the first row of the interlacing table T1 agree with the first row of the interlacing table T2, then the second row of the interlacing table T1 with the second row of the interlacing table T2. Thus the definition of the first interlacing table T corresponds to the addition of the interlacing table T1 and of the interlacing table T2, to which an interlacing table T' (shown in grey tint on FIG. 7) is added so that the first interlacing table T has the same number of positions in each of its columns and in each of its rows. In order to simplify the interlacing operations according to the embodiment described, the positions included in the interlacing table T', i.e. included in the first interlacing table T but not included in at least one of the interlacing tables T1 and T2, are said to be "invalid". This is because, after an interlacing implemented in the first interlacing table T, data could be moved in one of these positions.

An interlacing operation in an interlacing table usually consists in shifting the content of each of the rows and columns a certain number of times by circular permutations of the bits contained in the positions in the table.

Figures 8, 9:
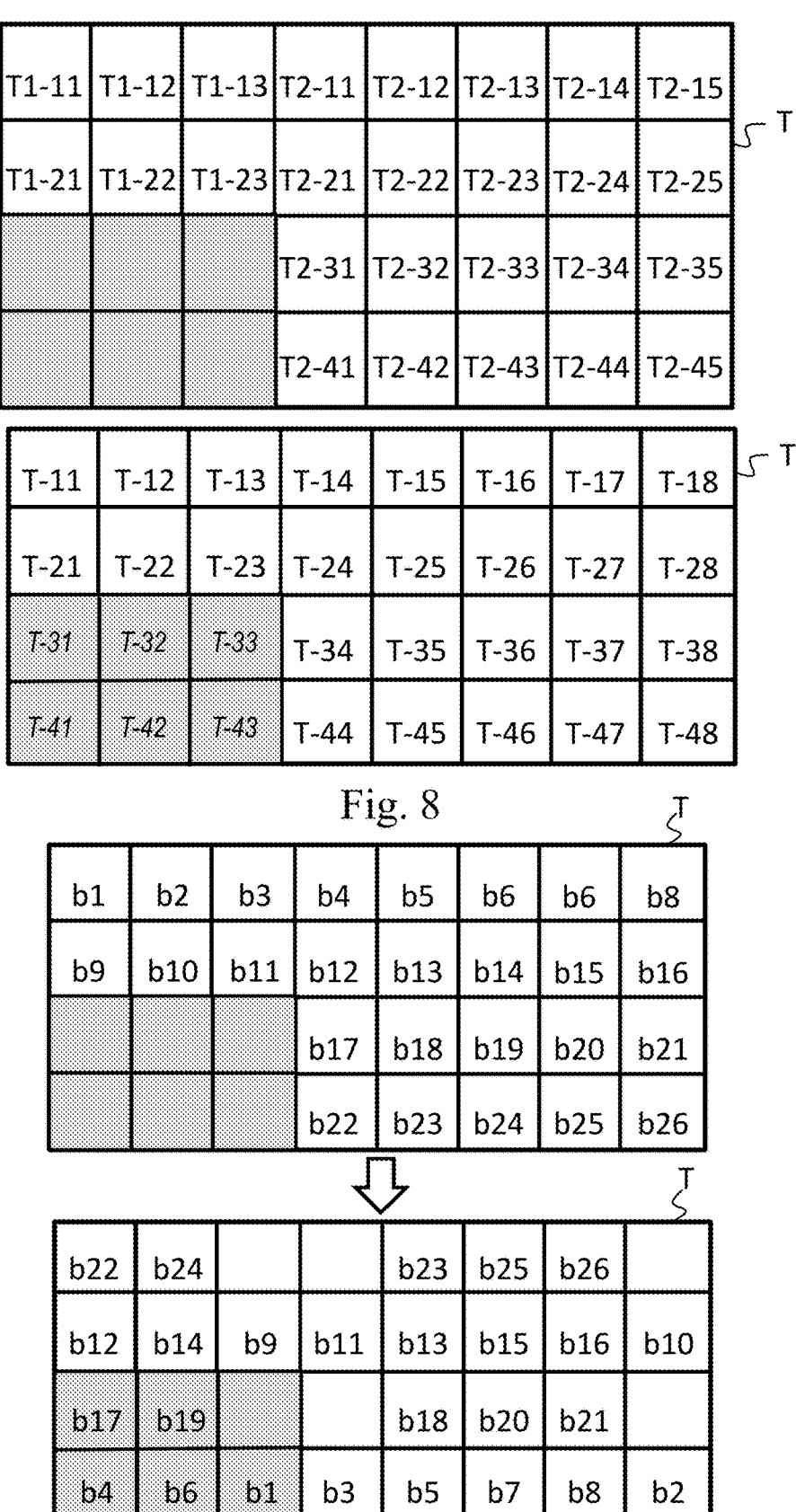
FIG. 8 illustrates the positions of the first interlacing table in FIG. 7 with particular references, according to a particular embodiment.
FIG. 9 illustrates an interlacing operation in the first interlacing table according to a particular embodiment.

FIG. 8 illustrates the correspondence of the tables particular to an identification of the positions in the first interlacing table T with the indices particular to an identification of the positions in each of the interlacing tables T1 and T2, or invalid positions of the interlacing table T'. Thus, for example, the position T1-11 of the interlacing table T1 corresponds to the position T-11 of the first interlacing table T, and the position T2-32 of the interlacing table T2 corresponds to the position T-35 of the first interlacing table T, which makes it possible to clearly understand how the positions are respectively identified depending on whether they refer to the first interlacing table T, obtained by concatenation, or to one of the interlacing tables T1 and T2 defined according to a type of communication medium and parameters related to these communication media, e.g. number of channels in RF and type of modulation, number of subcarriers and frequency bands in PLC).

The positions T-31, T-32, T-33, T-41, T-42 and T-43 are the invalid positions of the first interlacing table T.

FIG. 9 illustrates the interlacing operation performed in the first interlacing table T by the transmission method according to the invention. The top part of the figure shows the first interlacing table T defined prior to the interlacing so that each of the positions of the interlacing table T that is not invalid comprises a bit coming from the flow of bits to be interlaced (supplied, for example, at the output of a convolutional encoder, e.g. of the Reed-Solomon type). The bits b1 to b26 of the flow of bits are "loaded" from left to right and from top to bottom in the first interlacing table T so that the invalid positions are ignored. The bit b1 is loaded in the position T-11, b2 is loaded in the position T-12, . . . b13 in the position T-25, . . . and b26 in the position T-48. The invalid positions T-31, T-32, T-33, T-41, T-42 and T-43 of the first interlacing table T are ignored for the loading of the bits b1 to b26. In this way the first interlacing table T is obtained, comprising the interlacing tables T1 and T2, ready for an interlacing operation aimed at distributing the loaded data (bits) in a plurality of groups of data each attributed to a communication medium. The interlacing operation in itself is not described on FIG. 9 but is symbolised by an arrow leading from the representation of the state of the first interlacing table T prior to the interlacing, to the representation of the state of the first interlacing table T following the interlacing. Thus the bottom part of FIG. 9 shows the first interlacing table T after the global interlacing operation. The bit b22 occupies the position occupied by the bit b1 before the interlacing, the bit b24 occupies the position occupied by the bit b2 before the interlacing, the bit b23 occupies the position occupied by the bit b5 before the interlacing, . . . , and so on. The interlacing having been performed in complete rows and columns in the first interlacing table T, the result is that invalid positions may comprise bits following the interlacing. According to the embodiment, these bits are then moved to valid positions of the first interlacing table T.

Figure 10:
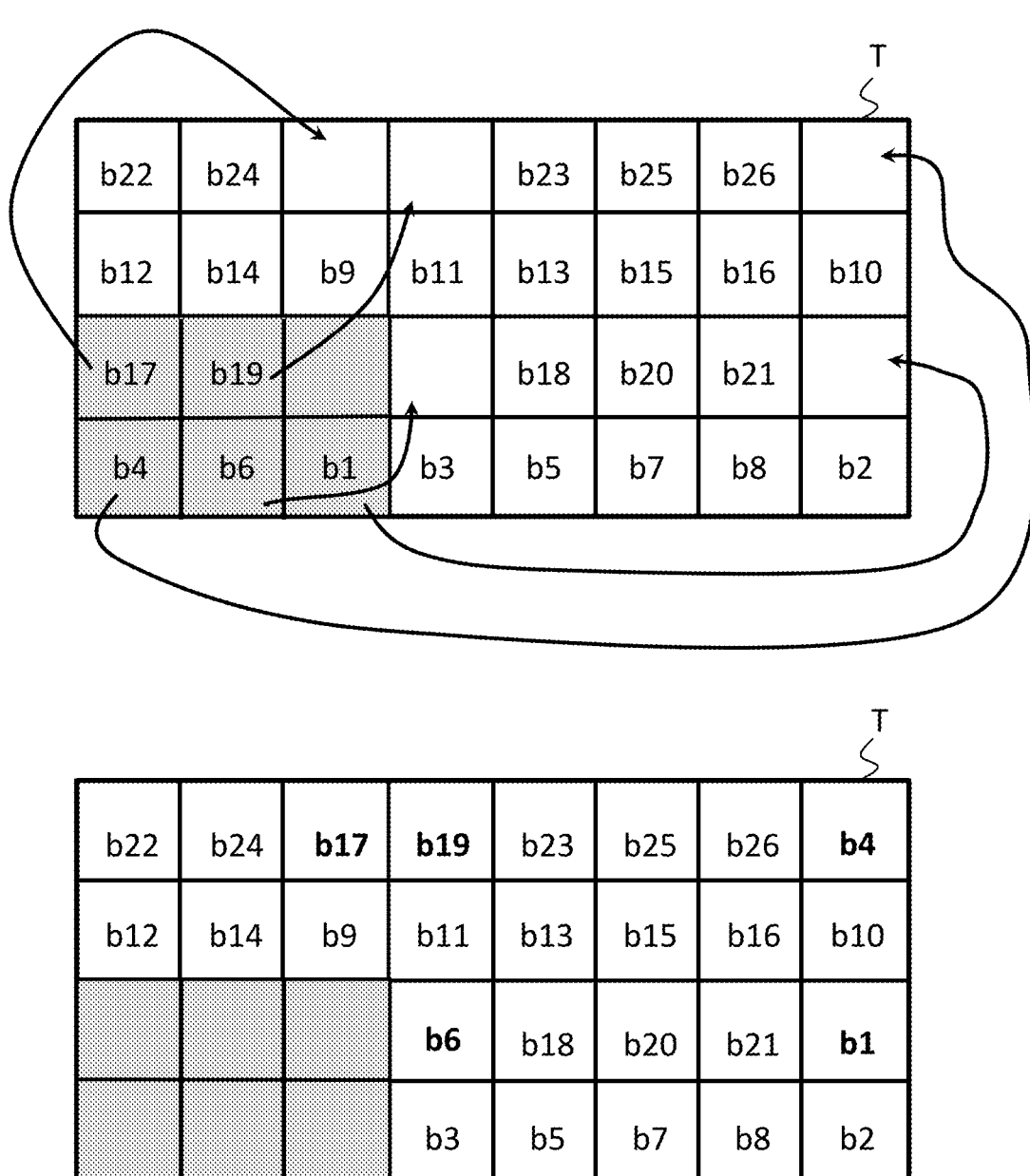
FIG. 10 illustrates a processing (movement) of interlaced bits in the first table according to a particular embodiment.

FIG. 10 illustrates movements of bits from invalid positions of the first interlacing table T to valid positions, i.e. positions included in one of the interlacing tables T1 and T2. These movements of the bits are symbolised by arrows.

According to one embodiment, these movements are performed by running through the invalid positions in the table T' from top to bottom and from left to right. As soon as an invalid position comprises a bit bi, where i is an index identifying the bit (on FIG. 10 $i$ is an integer belonging to [1; 26], this is moved to the first available valid position encountered while running through the first interlacing table T from top to bottom and from left to right. The top part of FIG. 10 illustrates the movements of the bits thus made, and the bottom part of FIG. 10 illustrates the respective positions of the bits at the end of this treatment (movements).

Cleverly, each of the interlacing tables T1 and T2 comprises a group of the bits of the data distributed in groups each corresponding to a communication medium from PLC and RF. In other words and according to the example described, the bits included in the interlacing table T1 are transmitted to the RF MAC sublayer with a view to transmission in RF, and the bits included in the interlacing table T2 are transmitted to the PLC MAC sublayer with a view to transmission in PLC.

Figure 11:
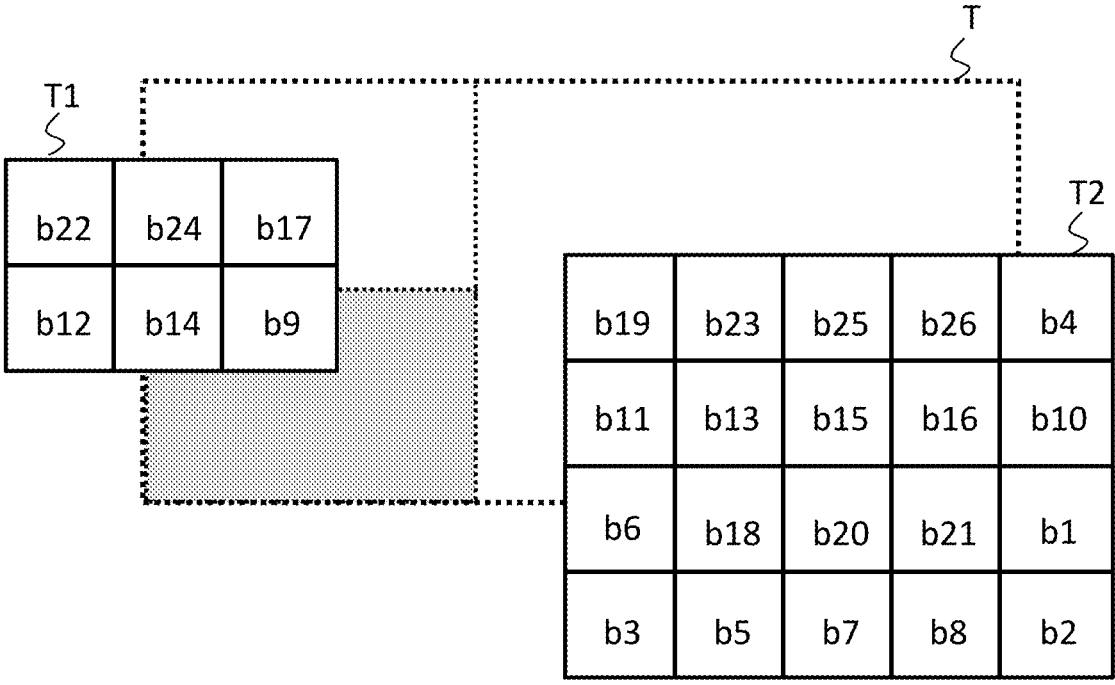
FIG. 11 illustrates a breaking down of the first table into second interlacing tables for creating groups of data, according to a particular embodiment.

FIG. 11 illustrates the distribution in groups of the first interlacing Table T into two interlacing tables T1 and T2 after the operations of interlacing and processing (movement) of the bits present at invalid positions, where applicable. This breakdown advantageously corresponds to the end of the interlacing useful to the distribution of the data to be transmitted between the two RF and PLC communication media used according to the example described.

The illustrated breakdown of the first interlacing table T into two interlacing tables T1 and T2, at the end of the interlacing, constitutes an orientation of the data in the form of bits of each of the groups of data and therefore of each of the interlacing tables T1 and T2 to the appropriate MAC layer. Moreover, for a given MAC layer the bits are also interlaced.

Though the embodiment described above illustrates a transmission to two different media (RF and PLC), the reasoning is similar with regard to a distribution of data to be transmitted to three, four or even more communication media. Thus the first interlacing table T (the largest) comprises as many interlacing tables T1, T2, Ti as there are distinct communication media.

Obviously, the purpose of the matrix representation of T, T1, T2 and T' is to simplify understanding of the arrangement of the data for the interlacing operations described, and each of the tables could be represented in the form of a vector of bits, for example horizontal or vertical, comprising segments delimiting the rows and columns previously described.

Figure 12:
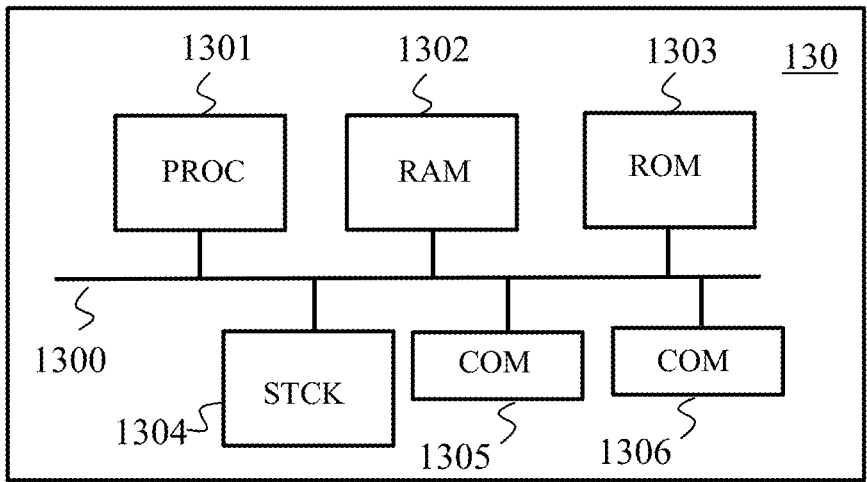
FIG. 12 illustrates schematically an example of hardware architecture of a node device of the mesh communication network according to a particular embodiment.

FIG. 12 illustrates schematically an example of hardware architecture of a node device 130 of the mesh communication network 120 according to one embodiment. Such a node device 130 is for example a meter or a data concentrator.

According to the example of hardware architecture shown in FIG. 12, the node device 130 then comprises, connected by a communication bus 1300: a processor or CPU (central processing unit) 1301; a random access memory RAM 1302; a read only memory ROM 1303; a storage unit such as a hard disk or such as a storage medium reader, e.g. an SD (Secure Digital) card reader; at least one communication interface 1305 enabling the node device 130 to communicate with the node devices belonging to its neighbourhood, e.g. the nodes 131 and 133 by powerline and at least one second communication interface 1306 enabling the node device 130 to communicate with the node devices belonging to its network neighbourhood by radio frequency.

The processor 1301 is capable of executing instructions loaded in the RAM 1302 from the ROM 1303, from an external memory (not shown), from a storage medium (such as an SD card), or from a communication network. When the node device is powered up, the processor 1301 is capable of reading instructions from the RAM 1302 and executing them. These instructions form a computer program causing the implementation, by the processor 1301, of all or some of the methods described in relation to FIGS. 3 to 11.

The methods described below in relation to FIGS. 3 to 11 can be implemented in software form by executing a set of instructions by a programmable machine, for example a DSP (digital signal processor) or a microcontroller, or be implemented in hardware form by a machine of a dedicated component, for example an FPGA (field-programmable gate array) or an ASIC (application-specific integrated circuit). In general, the node device 130 comprises electronic circuitry configured for implementing the methods described in relation to FIGS. 3 to 11.

The invention claimed is:

1. A transmission method for transmitting data from a first node device to a second node device belonging to a network neighbourhood of said first node device, said first and second node devices belonging to an electrical supply network and being configured for transmitting said data by powerline and by radio frequency, wherein the method causes said first node device to perform:

distributing the data in two groups of data by an operation of interlacing said data, each group being associated with a communication medium from among powerline and radio frequency, and said operation of interlacing said data being carried out using either:

(i) generating a first bit stream of N bits, each binary value being associated with one of the communication medium from among powerline and radio frequency, N being the number of data to be transmitted to the MAC layer, N being an integer greater than 0; permuting, by bit reversal, the bits in the first bit stream to obtain a second bit stream; and assigning each data item to the communication medium corresponding to the value of the bit at the same position in the second bit stream or, (ii) obtaining two interlacing tables, each interlacing table being associated with a communication medium and arranging the data to be transmitted within the interlacing tables;

transmitting each data item to a MAC layer of the communication medium associated with the group to which said data item belongs.

2. The method according to claim 1, which causes said first node to perform encoding the data by a Reed-Solomon encoder and wherein distributing the data in two groups of data by an operation of interlacing said data applies to the encoded data.

3. The method according to claim 1, wherein transmitting each data item to a MAC layer of the communication medium associated with a group to which said data item belongs comprises:

transmitting each data item to the MAC layer of the communication medium associated with the value of the bit corresponding to said data item in the second bit stream.

4. The method according to claim 3, wherein generating a first bit stream of N bits comprises:

a) initialising the parameters k, $N_{RF}$ and $N_{PLC}$ to 0;

b) if $D_{PLC}<D_{RF}$, positioning a bit $b_k$ at a first value and incrementing $N_{RF}$ by 1, otherwise positioning the bit $b_k$ at a second value and incrementing $N_{PLC}$ by 1, where $D_{PLC}$ is a rate available for the powerline communication medium and $D_{RF}$ is a rate available for the radio-frequency communication medium;

c) if $N_{PLC}/(N_{PLC}+N_{RF}) \le D_{PLC}/(D_{PLC}+D_{RF})$ positioning a bit $b_{k+1}$ at said second value and incrementing $N_{PLC}$ by 1, otherwise positioning the bit $b_{k+1}$ at said first value and incrementing $N_{RF}$ by 1;

d) if $(k+1)<N-1$, incrementing k by 1 and resuming at the step c), k being an index that identifies a bit $b_k$ in the first bit stream; $N_{PLC}$, respectively $N_{RF}$ representing a number of bits transmitted on the powerline communication medium, respectively the radio-frequency communication medium; $D_{PLC}$ being a rate of data available for the powerline communication medium and $D_{RF}$ being a rate of data available for the radio-frequency communication medium.

5. The method according to claim 1, wherein distributing the data in two groups of data by an operation of interlacing said data comprises:

transmitting each data item to the MAC layer of the communication medium associated with the interlacing table in which said data item is located.

6. The method according to claim 5, wherein obtaining two interlacing tables, each interlacing table being associated with a communication medium, comprises:

obtaining a first interlacing table noted T [m, n] of bits representing the data to be transmitted and wherein m is a number of row and n the number of column of the table T, the first interlacing table T comprising as many second interlacing tables Ti [$m_i$, $n_i$] of bits as there are communication media, each second interlacing table Ti [$m_i$, $n_i$] being attributed to only one of said communication media, differences in dimensions between second interlacing tables being liable to generate one or more so-called invalid positions included in the first interlacing table but not included in the at least one of the second interlacing tables, interlacing the bits by successive shifts of the rows m and of the columns n of the first interlacing table T [m, n], the successive shifts being performed in the form of circular permutations of the bits respectively by row and by column, moving any bit detected as present at an invalid position in the first interlacing table to a position in a second interlacing table that is available after the interlacing of the bits of the first interlacing table, so that each second interlacing table comprises bits allocated to one of said groups of data.

7. The method according to claim 1, wherein, in the case where a data item is transmitted by powerline, said data item is transmitted on at least one frequency band belonging to a set of frequency bands comprising:

the CENELEC A frequency band which ranges from 35 kHz to 91 kHz;

the CENELEC B frequency band which ranges from 98 kHz to 122 kHz; and the FCC frequency band which ranges from 150 kHz to 480 kHz or the ARIB frequency band which ranges from 150 kHz to 400 kHz.

8. The method according to claim 1, wherein, in the case where a data item is transmitted by radio frequency, said data item is transmitted on a frequency band ranging from 863 MHz to 870 MHz.

9. A non-transitory storage medium storing a computer program comprising instructions for implementing, by a processor, the transmission method according to claim 1, when said program is executed by said processor.

10. A node device belonging to an electrical supply network, said node device being configured for transmitting data by powerline and by radio frequency to another node in said electrical supply network belonging to its network neighbourhood, wherein the node device comprises circuitry causing the node device to perform:

distributing the data in two groups of data by an operation of interlacing said data, each group being associated with a communication medium from among powerline and radio frequency, said operation of interlacing said data being carried out using either:

(i) generating a first bit stream of N bits, each binary value being associated with one of the communication medium from among powerline and radio frequency, N being the number of data to be transmitted to the MAC layer, N being an integer greater than 0; permuting, by bit reversal, the bits in the first bit stream to obtain a second bit stream; and assigning each data item to the communication medium corresponding to the value of the bit at the same position in the second bit stream or, (ii) obtaining two interlacing tables, each interlacing table being associated with a communication medium and arranging the data to be transmitted within the interlacing tables, and transmitting each data item to a MAC layer of the communication medium associated with a group to which said data item belongs.

* * * * *